United States Patent
Kim

(10) Patent No.: US 6,452,432 B2
(45) Date of Patent: Sep. 17, 2002

(54) SIGNAL PROCESSING CIRCUITS HAVING A PAIR OF DELAY LOCKED LOOP (DLL) CIRCUITS FOR ADJUSTING A DUTY-CYCLE OF A PERIODIC DIGITAL SIGNAL AND METHODS OF OPERATING SAME

(75) Inventor: Kyu-hyoun Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/816,968

(22) Filed: Mar. 23, 2001

(30) Foreign Application Priority Data

Mar. 31, 2000 (KR) ......................................... 2000-16883

(51) Int. Cl.$^7$ ................................................. H04L 7/08
(52) U.S. Cl. ...................................... 327/158; 327/156
(58) Field of Search ................................ 327/156, 158, 327/141; 331/25, 2

(56) References Cited

U.S. PATENT DOCUMENTS

| | | | |
|---|---|---|---|
| 5,614,855 A | | 3/1997 | Lee et al. ..................... 327/158 |
| 5,675,620 A | * | 10/1997 | Chen ............................ 331/25 |
| 5,969,551 A | | 10/1999 | Fujioka ........................ 327/149 |
| 6,049,239 A | | 4/2000 | Eto et al. ..................... 327/158 |
| 6,107,826 A | | 8/2000 | Young et al. .................. 326/41 |

FOREIGN PATENT DOCUMENTS

| | | |
|---|---|---|
| EP | 1024599 A2 | 8/2000 |
| JP | 07128431 | 5/1995 |
| JP | 10276074 | 10/1998 |
| WO | WO 98/37656 | 8/1998 |

OTHER PUBLICATIONS

European Search Report, dated Jun. 29, 2001.

* cited by examiner

Primary Examiner—Dinh T. Le
(74) Attorney, Agent, or Firm—Myers Bigel Sibley & Sajovec

(57) ABSTRACT

A signal processing circuit includes a first delay locked loop (DLL) circuit that generates a first intermediate output signal in response to an input signal and a phase difference between a leading edge of a reference signal and a leading edge of a feedback signal and a second DLL circuit that generates a second intermediate output signal in response to the input signal and a phase difference between a trailing edge of the reference signal and a trailing edge of the feedback signal. Because the first and second intermediate output signals are based on the phase difference between the reference signal and the leading and trailing edges of a feedback signal, respectively, and the first and second intermediate output signals are not derived from the reference signal, the jitter that may be introduced into the first and second intermediate output signals may be reduced.

40 Claims, 7 Drawing Sheets

SIGNAL PROCESSING CIRCUITS HAVING A PAIR OF DELAY LOCKED LOOP (DLL) CIRCUITS FOR ADJUSTING A DUTY-CYCLE OF A PERIODIC DIGITAL SIGNAL AND METHODS OF OPERATING SAME

RELATED APPLICATION

This application claims the benefit of Korean Patent Application No. 2000-16883, filed Mar. 31, 2000, the disclosure of which is hereby incorporated herein by reference.

FIELD OF THE INVENTION

The present invention relates generally to signal processing circuits and, more particularly, to delay locked loop (DLL) circuits and methods of operating same.

BACKGROUND OF THE INVENTION

A delay locked loop (DLL) circuit may be used in an integrated circuit device to generate an internal clock signal based on an external clock signal that is provided to the integrated circuit device. Various circuits in the integrated circuit device may then use the internal clock signal. The DLL circuit may have a duty-cycle corrector circuit that is electrically connected thereto and adjusts the duty-cycle of the external clock signal to approximately 50%. The DLL circuit may derive the internal clock signal from the duty-cycle corrected clock signal.

FIG. 1 is a block diagram of a conventional DLL circuit and a duty-cycle corrector circuit. Referring now to FIG. 1, the duty-cycle corrector circuit 111 is connected in series with the DLL circuit 121. The duty-cycle corrector 111 corrects the duty-cycle of the external clock signal Clk_ext and generates a duty-cycle corrected clock signal Clk_dcc at an output terminal thereof. The DLL circuit 121 receives the duty-cycle corrected clock signal Clk_dcc and generates an internal clock signal Clk_int at an output terminal thereof. Unfortunately, both the duty-cycle corrector circuit 111 and the DLL circuit 121 may introduce jitter into the internal clock signal Clk_int. As shown in FIG. 2, the duty-cycle corrector circuit 111 may introduce jitter in the duty-cycle corrected clock signal Clk_dcc as represented by t1. Moreover, the DLL circuit 121 may introduce additional jitter into the internal clock signal Clk_int. The combined jitter in the internal clock signal Clk_int, which is introduced by the duty-cycle corrector circuit 111 and the DLL circuit 121, is represented by t2.

Conventional integrated circuit devices may include a duty-cycle corrector circuit that is electrically connected in series to the input of a DLL circuit and/or a duty-cycle corrector circuit that is electrically connected in series to the output of a DLL circuit 121. The additional duty-cycle corrector circuit may increase the jitter in the internal clock signal Clk_int. The jitter contained in the internal clock signal Clk_int may cause circuits in the integrated circuit device that use the internal clock signal Clk_int to malfunction. Accordingly, there exists a need for improved signal processing circuits that can generate clock signals having reduced jitter.

SUMMARY OF THE INVENTION

According to embodiments of the present invention, a signal processing circuit comprises a first delay locked loop (DLL) circuit that generates a first intermediate output signal in response to an input signal and a phase difference between a leading edge of a reference signal and a leading edge of a feedback signal and a second DLL circuit that generates a second intermediate output signal in response to the input signal and a phase difference between a trailing edge of the reference signal and a trailing edge of the feedback signal. Because the first and second intermediate output signals are based on the phase difference between the reference signal and the leading and trailing edges of a feedback signal, respectively, and the first and second intermediate output signals are not derived from the reference signal, the jitter that may be introduced into the first and second intermediate output signals may be reduced.

A mixer circuit may be used to generate an output signal in response to the first and second intermediate output signals. In particular embodiments, the mixer circuit generates a leading edge transition of the output signal in response to a leading edge transition of the first intermediate output signal and the mixer circuit generates a trailing edge transition of the output signal in response to a trailing edge transition of the second intermediate output signal. In accordance with embodiments of the present invention, the output signal and the feedback signal may be the same signal or a delay circuit may be used to generate the feedback signal in response to the output signal.

A duty-cycle corrector circuit may generate the reference signal in response to the input signal. Although the reference signal may have a duty-cycle of approximately 50%, the reference signal may contain jitter caused by the duty-cycle corrector circuit. The first and second intermediate output signals are based on the phase difference between the leading and trailing edges, respectively, of the reference signal and the feedback signal. Advantageously, because the jitter component in the reference signal typically has a higher frequency than the loop bandwidth of the first and second DLL circuits, the first and second intermediate output signals may be unaffected by jitter in the reference signal. Accordingly, jitter in the output signal may be reduced.

The mixer circuit may comprise a flip-flop circuit that generates the output signal in response to a set signal and a reset signal, which are generated by first and second logic circuits in response to the first and second intermediate output signals, respectively.

The first and second DLL circuits may comprise a delay unit that generates a plurality of delay signals corresponding to delayed versions of the input signal. The first DLL circuit may further comprise a first phase comparator circuit that determines the phase difference between the leading edge of the reference signal and the leading edge of the feedback signal and a first multiplexer that generates the first intermediate output signal by selecting a first one of the plurality of delay signals in response to the phase difference between the leading edge of the reference signal and the leading edge of the feedback signal. In particular embodiments, a first register may be used to latch the phase difference between the leading edge of the reference signal and the leading edge of the feedback signal so as to provide the phase difference to the first multiplexer.

The second DLL circuit may further comprise first and second inverters that generate a complementary reference signal and a complementary feedback signal, respectively, a second phase comparator circuit that determines the phase difference between the trailing edge of the reference signal and the trailing edge of the feedback signal, and a second multiplexer that generates the second intermediate output signal by selecting a second one of the plurality of delay signals in response to the phase difference between the trailing edge of the reference signal and the trailing edge of the feedback signal. In particular embodiments, a second register may be used to latch the phase difference between the trailing edge of the reference signal and the trailing edge of the feedback signal so as to provide the phase difference to the second multiplexer.

In further embodiments of the present invention, the first and second DLL circuits discussed above may be used to generate clock signals in integrated circuit memory devices. For example, because the first and second intermediate output signals may have reduced jitter, an input receiver circuit may generate processed data in response to input data and the first and second intermediate output signals. A memory cell array may store the processed data therein in response to the first and second intermediate output signals. In particular embodiments, interface logic may be used to couple the processed data from the input receiver circuit to the memory cell array, and an output buffer may be used to generate output data in response to the data stored in the memory cell array and the first and second intermediate output signals.

Thus, in summary, embodiments of the present invention may be used to generate a duty-cycle corrected signal from an original signal without introducing jitter from a duty-cycle corrector circuit into the duty-cycle corrected signal. The duty-cycle corrected signal may be used to drive other integrated circuit devices and may improve the reliability thereof due to the reduced jitter in the duty-cycle corrected signal.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
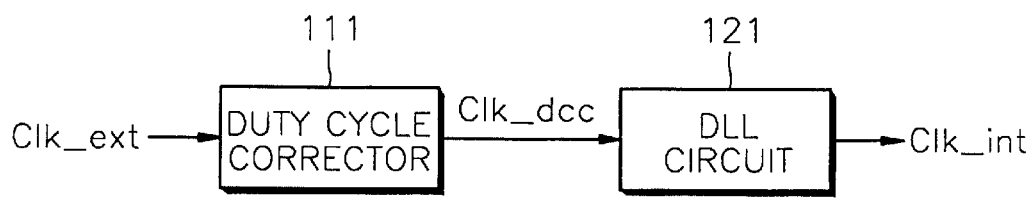
FIG. 1 is a block diagram of a conventional delay locked loop (DLL) circuit and a duty-cycle corrector circuit connected in series.
Figure 2:
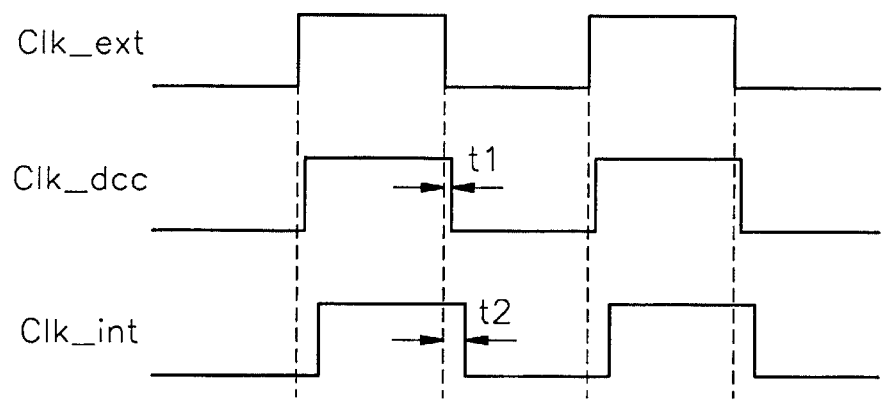
FIG. 2 is a signal timing diagram for signals associated with the conventional DLL circuit and duty-cycle corrector circuit.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 3:
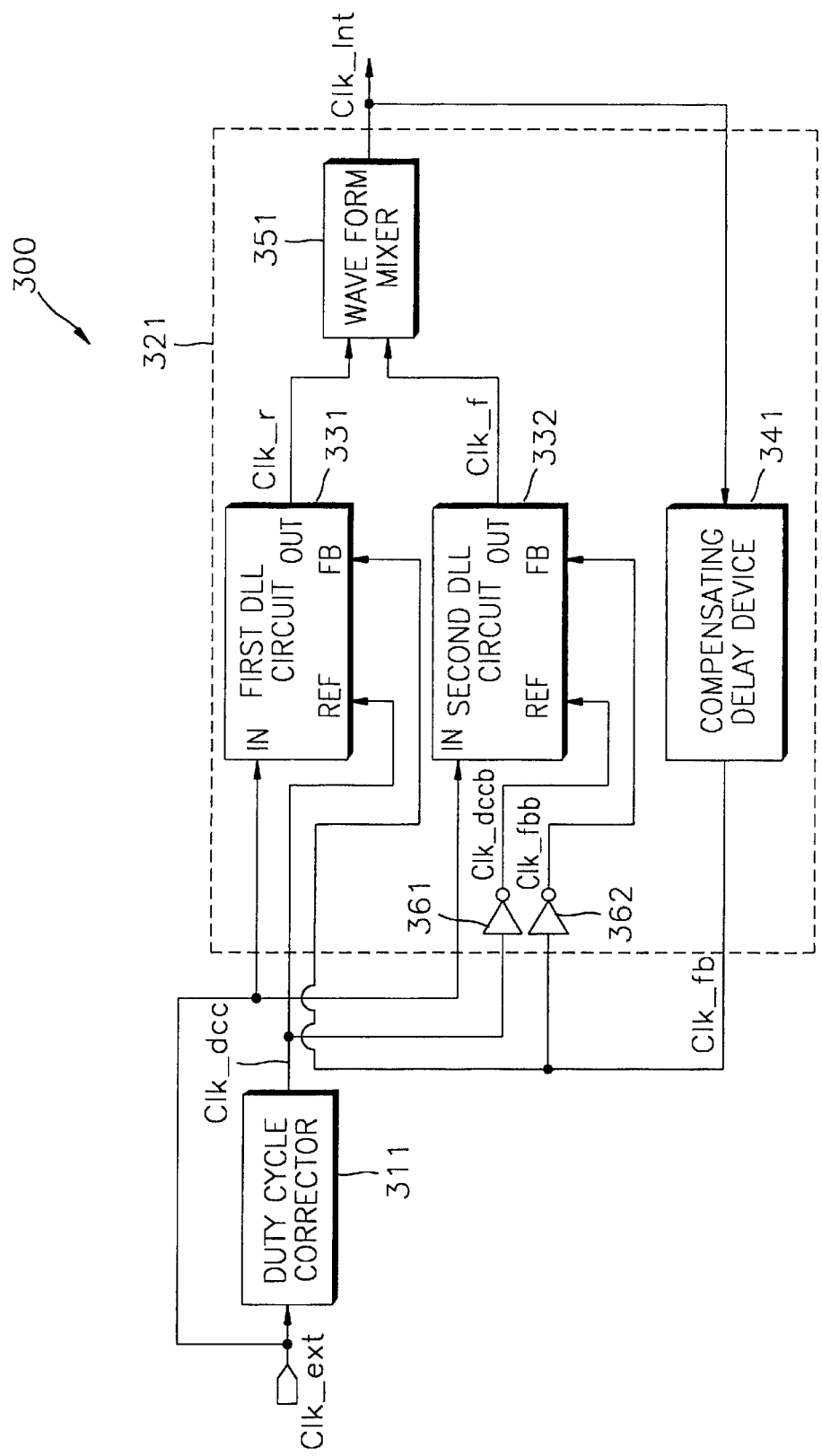
FIG. 3 is a block diagram that illustrates signal processing circuits in accordance with embodiments of the present invention.

FIG. 3 is a block diagram that illustrates signal processing circuits in accordance with embodiments of the present invention. A signal processing circuit 300 comprises a duty-cycle corrector circuit 311 and a delay locked loop (DLL) circuit 321 connected in series. The DLL circuit 321 comprises a first DLL circuit 331, a second DLL circuit 332, a waveform mixer circuit 351, a compensating delay device 341, and inverters 361 and 362, which are configured as shown. The duty-cycle corrector circuit 311 generates a duty-cycle corrected output signal Clk_dcc by adjusting the duty-cycle of an external clock signal Clk_ext to approximately 50% when the duty-cycle of the external clock signal Clk_ext is shorter or longer than 50%. A duty-cycle refers to the portion of time that a periodic signal is in a particular state as compared to the entire period of the signal. For example, as used herein, a duty-cycle that is less than 50% means that the high-voltage interval of the external clock signal Clk_ext is shorter than the low-voltage interval of the external clock signal Clk_ext. Similarly, a duty-cycle that is greater than 50% means that the high-voltage interval of the external clock signal Clk_ext is longer than the low-voltage interval of the external clock signal Clk_ext. The clock signal Clk_ext is referred to as an external clock signal because it is provided as an input to the signal processing circuit 300.

The DLL circuit 321 generates the internal clock signal Clk_int in response to the external clock signal Clk_ext, the duty-cycle corrected output signal Clk_dcc, and a feedback signal Clk_fb. The first and second DLL circuits 331 and 332 are connected in parallel as shown and may be used in conjunction with the other circuits comprising the signal processing circuit 300 to generate the internal clock signal Clk_int with approximately the same period as the external clock signal Clk_ext, but with a duty-cycle of approximately 50%. The internal clock signal Clk_int is referred to as an internal clock signal because it is generated as an output signal by the signal processing circuit 300 and may be used to drive other circuits in a device.

When the duty-cycle of the external clock signal Clk_ext is approximately 50%, the first and second DLL circuits 331 and 332 generate respective intermediate output signals Clk_r and Clk_f substantially in phase with one another and with duty-cycles of approximately 50%. When the duty-cycle of the external clock signal Clk_ext is less than 50%, then the first and second DLL circuits 331 and 332 generate the respective intermediate output signals Clk_r and Clk_f with duty-cycles less than 50% and with the phase of the first intermediate output signal Clk_r leading that of the second intermediate output signal Clk_f. When the duty-cycle of the external clock signal Clk_ext is greater than 50%, then the first and second DLL circuits 331 and 332 generate the respective intermediate output signals Clk_r and Clk_f with duty-cycles greater than 50% and with the phase of the second intermediate output signal Clk_f leading that of the first intermediate output signal Clk_r.

Figure 7A:
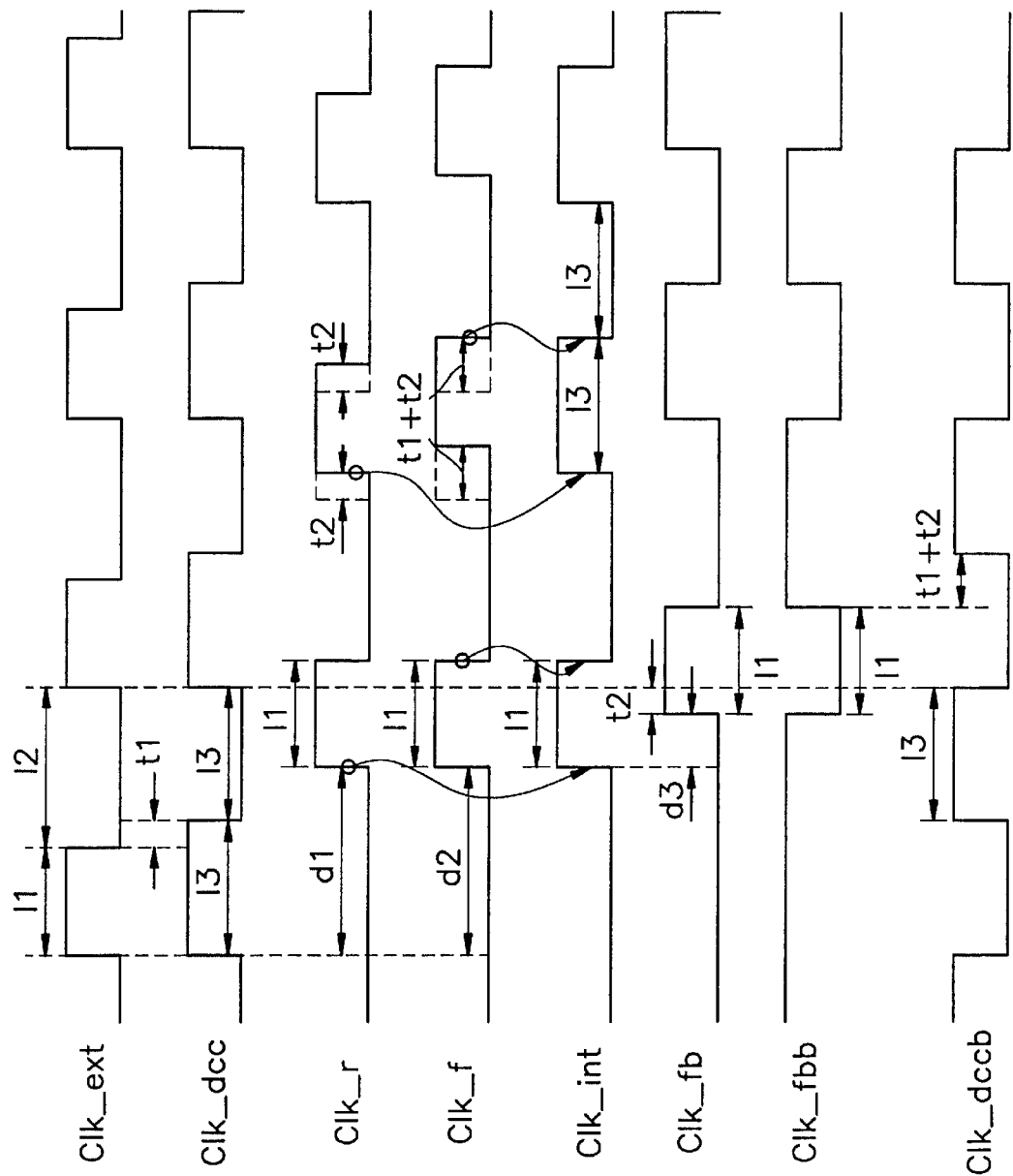
FIGS. 7A and 7B are signal timing diagrams for signals associated with signal processing circuits in accordance with embodiments of the present invention.
Figure 7B:
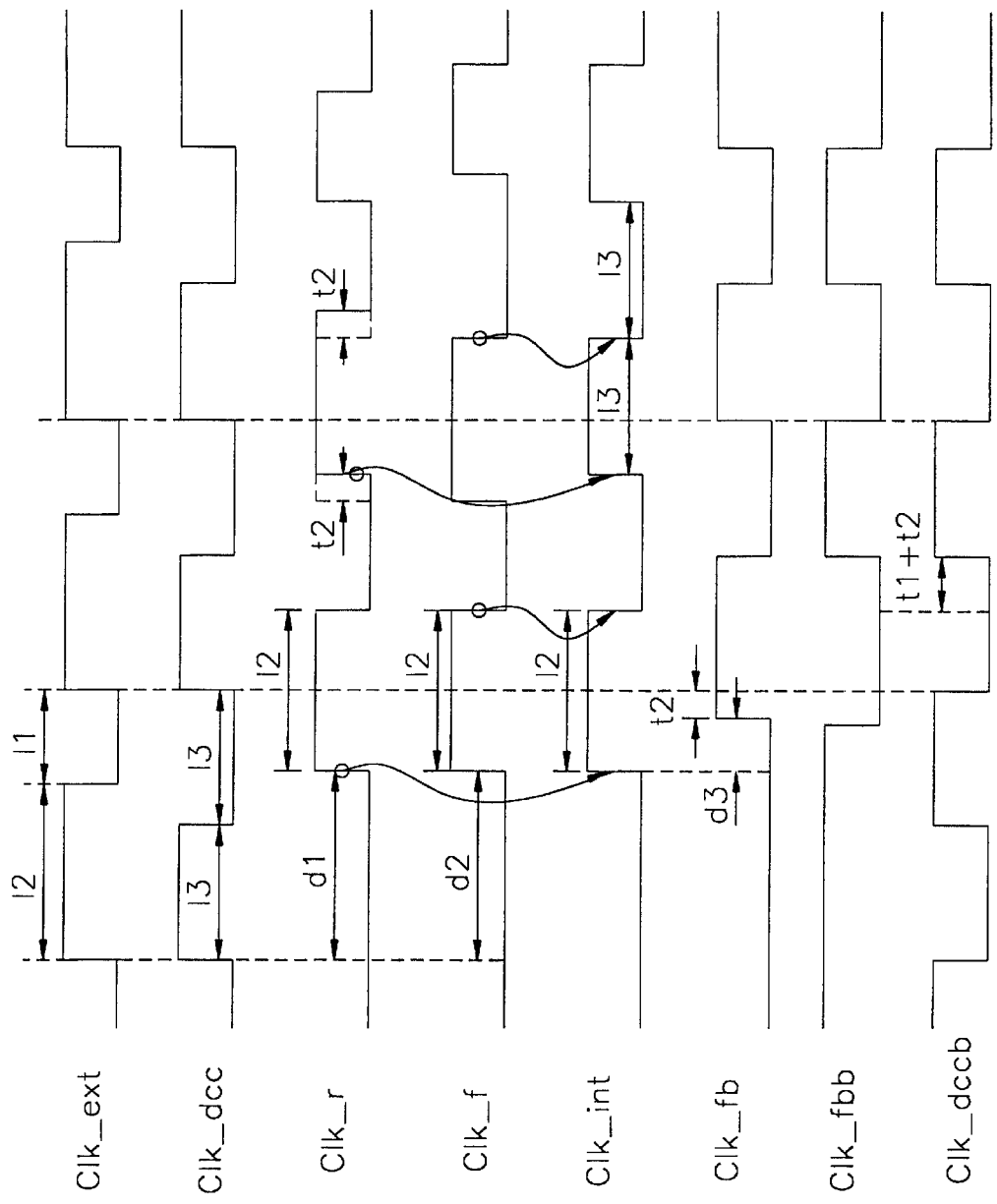

The first DLL circuit 331 generates the first intermediate output signal Clk_r in response to the duty-cycle corrected output signal Clk_dcc, the external clock signal Clk_ext, and the feedback signal Clk_fb. The first DLL circuit 331 generates the first intermediate output signal Clk_r by delaying the external clock signal Clk_ext by a first predetermined time, which is shown as time period d1 in FIGS. 7A and 7B. The first DLL circuit 331 uses the duty-cycle corrected output signal Clk_dcc as a reference signal and synchronizes the leading edge (i.e., the rising edge) of the duty-cycle corrected output signal Clk_dcc with the leading edge (i.e., the rising edge) of the feedback signal Clk_fb so that there is substantially no phase difference therebetween. To synchronize the duty-cycle corrected output signal Clk_dcc with the feedback signal Clk_fb, the first predetermined time d1 shown in FIGS. 7A and 7B is adjusted so as to reduce the phase difference between the rising edges of the two signals. To further improve the synchronization of the duty-cycle corrected output signal Clk_dcc with the feedback signal Clk_fb, the first intermediate output signal Clk_r is further delayed by a time interval t2, which corresponds to the phase difference between the rising edge of the duty-cycle corrected output signal Clk_dcc and the rising edge of the feedback signal Clk_fb.

The compensating delay device circuit 341 generates the feedback signal Clk_fb by applying a predetermined delay, which is shown as time period d3 in FIGS. 7A and 7B, to the internal clock signal Clk_int. The inverters 361 and 362 generate a complementary duty-cycle corrected output signal Clk_dccb and a complementary feedback signal Clk_fb, respectively, by inverting the duty-cycle corrected output signal Clk_dcc and inverting the feedback signal Clk_fb, respectively.

The second DLL circuit 332 generates the second intermediate output signal Clk_f in response to the complementary duty-cycle corrected output signal Clk_dccb, the external clock signal Clk_ext, and the complementary feedback signal Clk_fbb. The second DLL circuit 332 generates the second intermediate output signal Clk_f by delaying the external clock signal Clk_ext by a second predetermined time, which is shown as time period d2 in FIGS. 7A and 7B. The second DLL circuit 332 uses the complementary duty-cycle corrected output signal Clk_dccb as a reference signal and synchronizes the leading edge (i.e., the rising edge) of the complementary duty-cycle corrected output signal Clk_dccb with the leading edge (ie., the rising edge) of the complementary feedback signal Clk_fbb so that there is substantially no phase difference therebetween. Note that the leading edge of the complementary duty-cycle corrected output signal Clk_dccb and the leading edge of the complementary feedback signal Clk_fbb correspond to the trailing edge (i.e., the falling edge) of the duty-cycle corrected output signal Clk_dcc and the trailing edge (ie., falling edge) of the feedback signal Clk_fb, respectively. To synchronize the complementary duty-cycle corrected output signal Clk_dccb with the complementary feedback signal Clk_fbb, the second predetermined time d2 shown in FIGS. 7A and 7B is adjusted so as to reduce the phase difference between the rising edges of the two signals. When the duty-cycle of the external clock signal Clk_ext is less than 50% as shown in FIG. 7A, the second intermediate output signal Clk_f is further delayed by a time interval t2, which corresponds to the delay applied to the first intermediate output signal Clk_r discussed above, plus a time interval t1, which accounts for the phase difference between the falling edge of the duty-cycle corrected output signal Clk_dcc and the falling edge of the external clock signal Clk_ext. In other words, the time interval t1 corresponds to the period by which the external clock signal Clk_ext falls short of attaining a 50% duty-cycle.

A waveform mixer circuit 351 generates the internal clock signal Clk_int in response to the first and second intermediate output signals Clk_r and Clk_f, respectively. Specifically, the leading edge (i.e., the rising edge) transition of the internal clock signal Clk_int is generated in response to the leading edge (i.e., the rising edge) transition of the first intermediate output signal Clk_r and the trailing edge (i.e., the falling edge) transition of the internal clock signal Clk_int is generated in response to the trailing edge (i.e., the falling edge) transition of the second intermediate output signal Clk_f. Thus, even though the respective duty-cycles of the external clock signal Clk_ext and the first and second intermediate output signals Clk_r and Clk_f may be greater or less than 50%, the duty-cycle of the internal clock signal Clk_int is approximately 50%.

As described above, the first and second DLL circuits 331 and 332 in conjunction with the other circuits comprising the signal processing circuit 300 may generate the internal clock signal Clk_int with approximately the same period as the external clock signal Clk_ext, but with a duty-cycle of approximately 50%. Advantageously, the internal clock signal Clk_int, which is generated by the DLL circuit 321, may not contain jitter introduced by the duty-cycle corrector circuit 311 because the internal clock signal Clk_int is generated based on delayed versions of the external clock signal Clk_ext. Thus, the internal clock signal Clk_int jitter may be limited to that which is introduced by the DLL circuit 321. In accordance with embodiments of the present invention, the duty-cycle corrector circuit 311 generates a duty-cycle corrected output signal Clk_dcc, which is used by the DLL circuit 321 as a reference signal to generate the first and second intermediate output signals Clk_r and Clk_f. Because the jitter component in the duty-cycle corrected output signal Clk_dcc has a higher frequency than the loop bandwidth of the DLL circuit 321, the first and second intermediate output signals Clk_f and Clk_r may be unaffected by the jitter in the duty-cycle corrected output signal Clk_dcc. Accordingly, the jitter in the internal clock signal Clk_int may be reduced.

In accordance with further embodiments of the present invention, a second duty-cycle corrector circuit (not shown) may be electrically connected in series to the output of the DLL circuit 321 so that the second duty-cycle corrector circuit applies further duty-cycle correction to the internal clock signal Clk_int. Because the second DLL circuit may introduce jitter into the clock signal, a second DLL circuit (not shown) may be connected in series to the output of the second duty-cycle corrector circuit as discussed hereinabove with respect to the DLL circuit 321 connected in series to the output of the duty-cycle corrector circuit 311.

Figure 4:
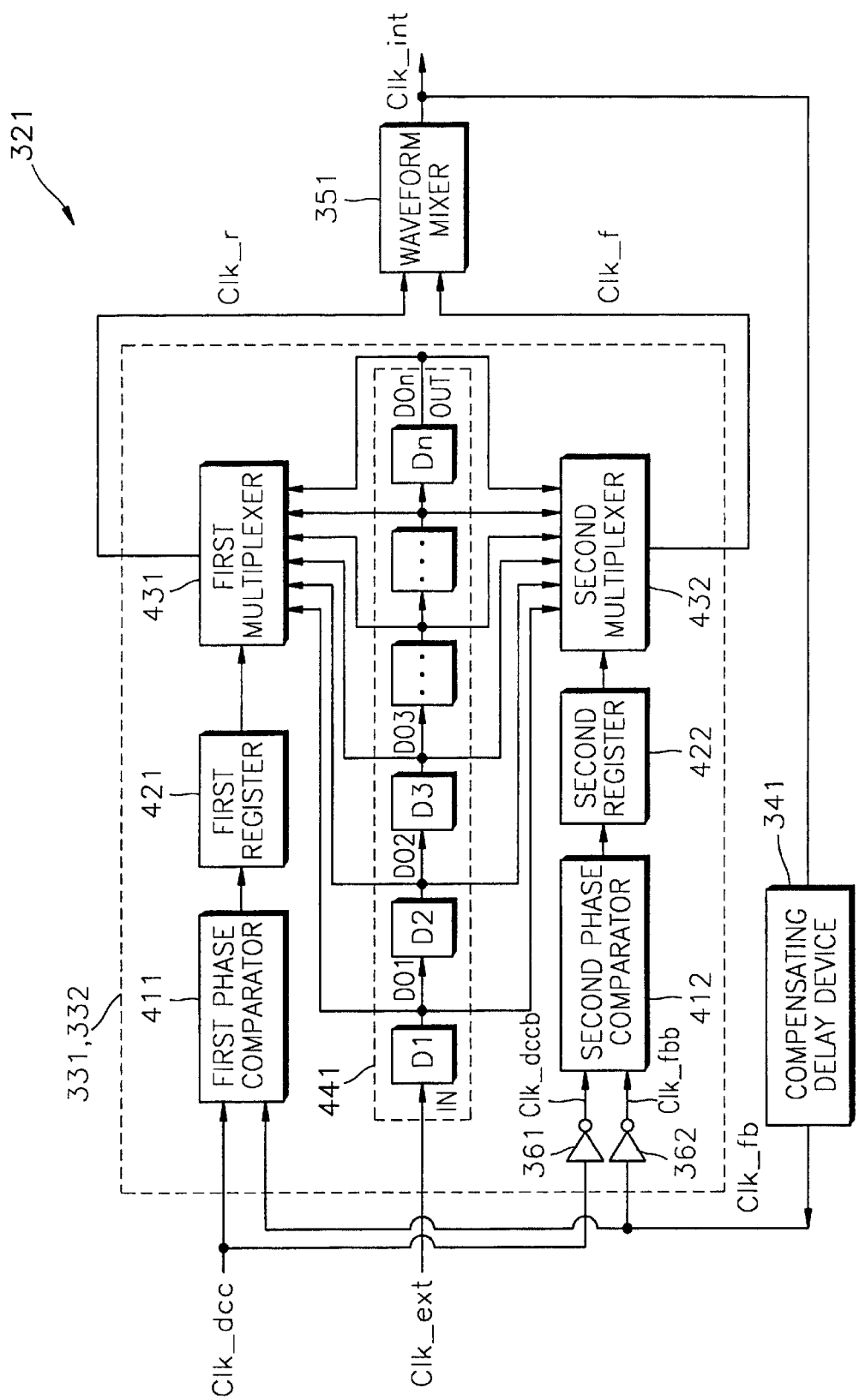
FIG. 4 is a block diagram that illustrates DLL circuits in accordance with embodiments of the present invention.

FIG. 4 is a detailed block diagram that illustrates DLL circuits in accordance with embodiments of the present invention. The first DLL circuit 331 comprises a first phase comparator circuit 411, a first register 421, and a first multiplexer 431, which are configured as shown. The second DLL circuit 332 comprises a second phase comparator circuit 412, a second register 422, and a second multiplexer 432, which are configured as shown. The first and second DLL circuits 331 and 332 may further comprise a delay unit 441, which is shared between the first and second DLL circuits 331 and 332 as shown.

The first phase comparator circuit 411 compares the phases of the duty-cycle corrected output signal Clk_dcc and the feedback signal Clk_fb and generates an output signal that is indicative of the phase difference between the two signals. More specifically, the first phase comparator circuit 411 generates an output signal that is indicative of the phase difference between the leading edge of the duty-cycle corrected output signal Clk_dcc and the leading edge of the feedback signal Clk_fb. The first register 421 may be embodied as a flip-flop and latches the phase difference signal, which is output from the first phase comparator circuit 411. The first multiplexer 431 selects one of a plurality of delay signals D01–D0n, which are generated as output signals from the delay unit 441, in response to the phase difference signal output from the first register 421. The delay unit 441 comprises a plurality of unit delay devices D1 through Dn, which are connected in series and respectively generate the plurality of delay signals D01 through D0n by delaying the external clock signal Clk_ext. The farther the delay signal D01–D0n is from the input terminal of the delay unit 441, the longer the delay between the delay signal and the external clock signal Clk_ext. The selected delay signal is output from the first multiplexer 431 as the first intermediate output signal Clk_r.

In more detail, when the phase difference between the leading edge of the duty-cycle corrected output signal Clk_dcc and the leading edge of the feedback signal Clk_fb is relatively large, the first multiplexer 431 generates the first intermediate output signal Clk_r by selecting one of the output signals D01–D0n from the delay unit 441 in which the delay applied to the external clock signal Clk_ext is relatively long. Conversely, when the phase difference between the leading edge of the duty-cycle corrected output signal Clk_dcc and the leading edge of the feedback signal Clk_fb is relatively small, the first multiplexer 431 generates the first intermediate output signal Clk_r by selecting one of the output signals D01–D0n from the delay unit 441 in which the delay applied to the external clock signal Clk_ext is relatively short.

The second phase comparator circuit 412 compares the phases of the complementary duty-cycle corrected output signal Clk_dccb and the complementary feedback signal Clk_fbb and generates an output signal that is indicative of the phase difference between the two signals. More specifically, the second phase comparator circuit 412 generates an output signal that is indicative of the phase difference between the leading edge of the complementary duty-cycle corrected output signal Clk_dccb and the leading edge of the complementary feedback signal Clk_fbb. The second register 422 may be embodied as a flip-flop and latches the phase difference signal, which is output from the second phase comparator circuit 412. The second multiplexer 432 selects one of the plurality of delay signals D01–D0n, which are generated as output signals from the delay unit 441, in response to the phase difference signal output from the second register 422. The selected delay signal is output from the second multiplexer 432 as the second intermediate output signal Clk_f.

In more detail, when the phase difference between the leading edge of the complementary duty-cycle corrected output signal Clk_dccb and the leading edge of the complementary feedback signal Clk_fbb is relatively large, the second multiplexer 432 generates the second intermediate output signal Clk_f by selecting one of the output signals D01–D0n from the delay unit 441 in which the delay applied to the external clock signal Clk_ext is relatively long. Conversely, when the phase difference between the leading edge of the complementary duty-cycle corrected output signal Clk_dccb and the leading edge of the complementary feedback signal Clk_fbb is relatively small, the second multiplexer 432 generates the first intermediate output signal Clk_f by selecting one of the output signals D01–D0n from the delay unit 441 in which the delay applied to the external clock signal Clk_ext is relatively short.

In summary, the first multiplexer 431 initially selects one of the output signals D01–D0n from the delay unit 441 such that the first intermediate output signal Clk_r is delayed relative to the external clock signal Clk_ext by a first predetermined time period d1. The first multiplexer 431 subsequently generates the first intermediate output signal Clk_r by selecting one of the output signals D01–D0n from the delay unit 441 based on the phase difference between the leading edge of the duty-cycle corrected output signal Clk_dcc and the leading edge of the feedback signal Clk_fb.

Similarly, the second multiplexer 432 initially selects one of the output signals D01–D0n from the delay unit 441 such that the second intermediate output signal Clk_f is delayed relative to the external clock signal Clk_ext by a second predetermined time period d2. The second multiplexer 432 subsequently generates the second intermediate output signal Clk_f by selecting one of the output signals D01–D0n from the delay unit 441 based on the phase difference between the leading edge of the complementary duty-cycle corrected output signal Clk_dccb and the leading edge of the complementary feedback signal Clk_fbb.

Figure 5:
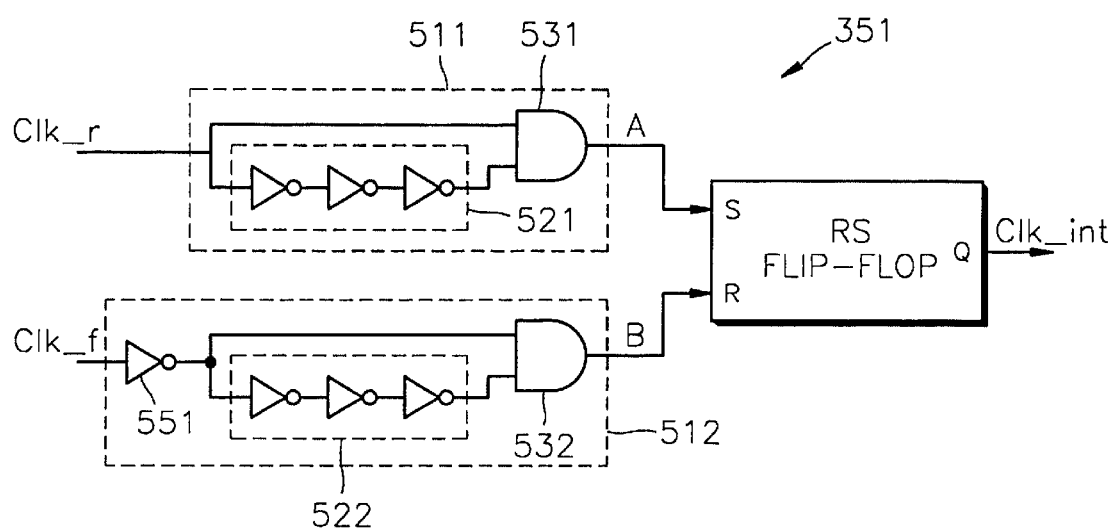
FIG. 5 is a schematic that illustrates mixer circuits in accordance with embodiments of the present invention.
Figure 6:
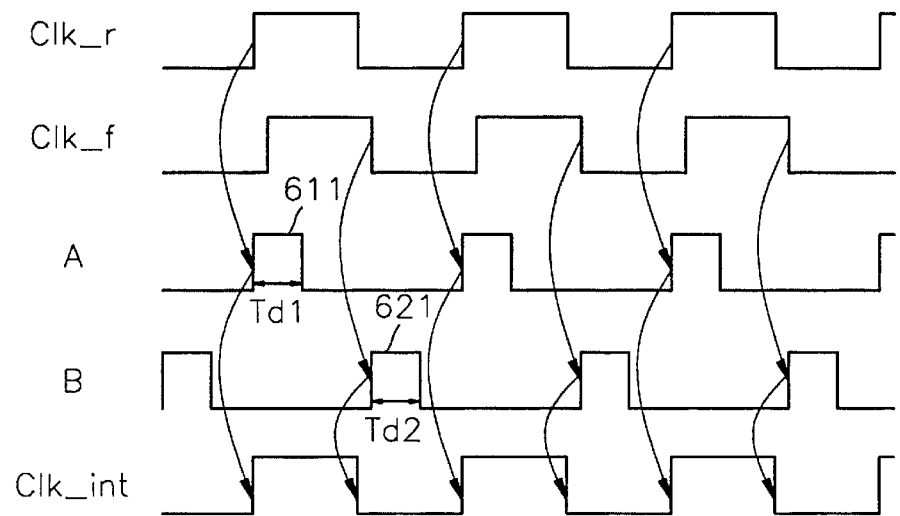
FIG. 6 is a signal timing diagram for signals associated with mixer circuits in accordance with embodiments of the present invention.

FIG. 5 is a schematic that illustrates waveform mixer circuits in accordance with embodiments of the present invention. The waveform mixer circuit 351 comprises pulse initiators 511 and 512, and a flip-flop 541, which are configured as shown. The pulse initiator 511 generates a logic signal A in response to the first intermediate output signal Clk_r and comprises an inverter chain 521 and an AND gate 531, which are configured as shown. Referring now to FIG. 6, the pulse initiator 511 generates a pulse signal 611 when the first intermediate output signal Clk_r transitions from a logic low level to a logic high level. The width Td1 of the pulse signal 611 is determined based on the number of inverters comprising the inverter chain 521. Specifically, the larger the number of inverters that comprise the inverter chain 521, the longer the width Td1 of the pulse signal 611. Conversely, the smaller the number of inverters that comprise the inverter chain 521, the shorter the width td1 of the pulse signal 621.

The pulse initiator 512 generates a logic signal B in response to the second intermediate output signal Clk_f and comprises an inverter chain 522 and an AND gate 532, which are configured as shown. Referring now to FIG. 6, the pulse initiator 512 generates a pulse signal 621 when the second intermediate output signal Clk_f transitions from a logic high level to a logic low level. The width Td2 of the pulse signal 621 is determined based on the number of inverters comprising the inverter chain 522. Specifically, the larger the number of inverters that comprise the inverter chain 522, the longer the width Td2 of the pulse signal 621. Conversely, the smaller the number of inverters that comprise the inverter chain 522, the shorter the width Td2 of the pulse signal 621.

The flip-flop 541 generates the internal clock signal Clk_int in response to the logic signals A and B, which are output from the pulse initiators 511 and 512, respectively. As shown in FIG. 6, the internal clock signal Clk_int transitions from a logic low level to a logic high level in response to a transition of the pulse signal 611 from a logic low level to a logic high level. The internal clock signal Clk_int transitions from a logic high level to a logic low level in response to a transition of the pulse signal 621 from a logic low level to a logic high level. The flip-flop 541 may be implemented as a SR (set-reset) flip-flop. Thus, the waveform mixer circuit 351 may be viewed as generating the internal clock signal Clk_int by mixing the rising edge of the first intermediate output signal Clk_r with the falling edge of the second intermediate output signal Clk_f.

FIGS. 7A and 7B are signal timing diagrams that illustrate operations of signal processing circuits in accordance with embodiments of the present invention. Referring now to FIG. 7A, the external clock signal Clk_ext has a duty-cycle of less than 50%; therefore, the logic high interval I1 is shorter than the logic low interval I2.

The duty-cycle of the duty-cycle corrected output signal Clk_dcc is approximately 50%; therefore, the logic high and logic low intervals of the duty-cycle corrected output signal Clk_dcc are approximately the same and are identified as intervals I3.

As discussed hereinabove, the first DLL circuit 331 generates the first intermediate output signal Clk_r by initially delaying the external clock signal Clk_ext by the first predetermined time period d1. Similarly, the second DLL circuit 332 generates the second intermediate output signal Clk_f by initially delaying the external clock signal Clk_ext by the second predetermined time period d2. The waveform mixer circuit 351 generates the internal clock signal Clk_int based on the leading edge (i.e., the rising edge) of the first intermediate output signal Clk_r and the trailing edge (i.e., the falling edge) of the second intermediate output signal Clk_f.

The compensating delay device circuit 341 generates the feedback signal Clk_fb by applying a predetermined time delay d3 to the internal clock signal Clk_int. To improve the synchronization of the duty-cycle corrected output signal Clk_dcc with the feedback signal Clk_fb, the first DLL circuit 331 generates the first intermediate output signal Clk_r with an additional delay of t2, which corresponds to the phase difference between the rising edge of the duty-cycle corrected output signal Clk_dcc and the rising edge of the feedback signal Clk_fb. To improve the synchronization of the complementary duty-cycle corrected output signal Clk_dccb with the complementary feedback signal Clk_fbb, the second DLL circuit 332 generates the second intermediate output signal Clk_f with an additional delay of t1 plus t2. Time interval t1 corresponds to the phase difference between the falling edge of the duty-cycle corrected output signal Clk_dcc and the falling edge of the external clock signal Clk_ext.

Accordingly, the waveform mixer circuit 351 generates the leading edge (i.e., the rising edge) transition of the internal clock signal Clk_int in response to the leading edge (i.e., the rising edge) transition of the first intermediate output signal Clk_r and generates the trailing edge (i.e., the falling edge) transition of the internal clock signal Clk_int in response to the trailing edge (i.e., the falling edge) transition of the second intermediate output signal Clk_f. The duty-cycle of the internal clock signal Clk_int is approximately 50%.

Referring now to FIG. 7B, the external clock signal Clk_ext has a duty-cycle greater than 50%; therefore, the logic high interval I1 is longer than the logic low interval I2. The duty-cycle of the duty-cycle corrected output signal Clk_dcc is approximately 50%; therefore, the logic high and logic low intervals of the duty-cycle corrected output signal Clk_dcc are approximately the same and are identified as intervals I3.

The first DLL circuit 331 generates the first intermediate output signal Clk_r by initially delaying the external clock signal Clk_ext by the first predetermined time period d1. Similarly, the second DLL circuit 332 generates the second intermediate output signal Clk_f by initially delaying the external clock signal Clk_ext by the second predetermined time period d2. The waveform mixer circuit 351 generates the internal clock signal Clk_int based on the leading edge (i.e., the rising edge) of the first intermediate output signal Clk_r and the trailing edge (i.e., the falling edge) of the second intermediate output signal Clk_f.

The compensating delay device circuit 341 generates the feedback signal Clk_fb by applying a predetermined time delay d3 to the internal clock signal Clk_int. To improve the synchronization of the duty-cycle corrected output signal Clk_dcc with the feedback signal Clk_fb, the first DLL circuit 331 generates the first intermediate output signal Clk_r with an additional delay t2, which corresponds to the phase difference between the rising edge of the duty-cycle corrected output signal Clk_dcc and the rising edge of the feedback signal Clk_fb. Because the duty-cycle of the external clock signal Clk_ext is greater than 50%, the second DLL circuit 332 need not generate the second intermediate output signal Clk_f with additional delay.

Accordingly, the waveform mixer circuit 351 generates the leading edge (i.e., the rising edge) transition of the internal clock signal Clk_int in response to the leading edge (i.e., the rising edge) transition of the first intermediate output signal Clk_r and generates the trailing edge (i.e., the falling edge) transition of the internal clock signal Clk_int in response to the trailing edge (i.e., the falling edge) transition of the second intermediate output signal Clk_f. The duty-cycle of the internal clock signal Clk_int is approximately 50%.

As illustrated in FIGS. 7A and 7B, even though the duty-cycle of the external clock signal Clk_ext may be greater or less than 50%, the DLL circuit 321 in cooperation with the waveform mixer circuit 351 may generate the internal clock signal Clk_int based on delayed versions of the external clock signal Clk_ext that has a duty-cycle of approximately 50%.

Figure 8:
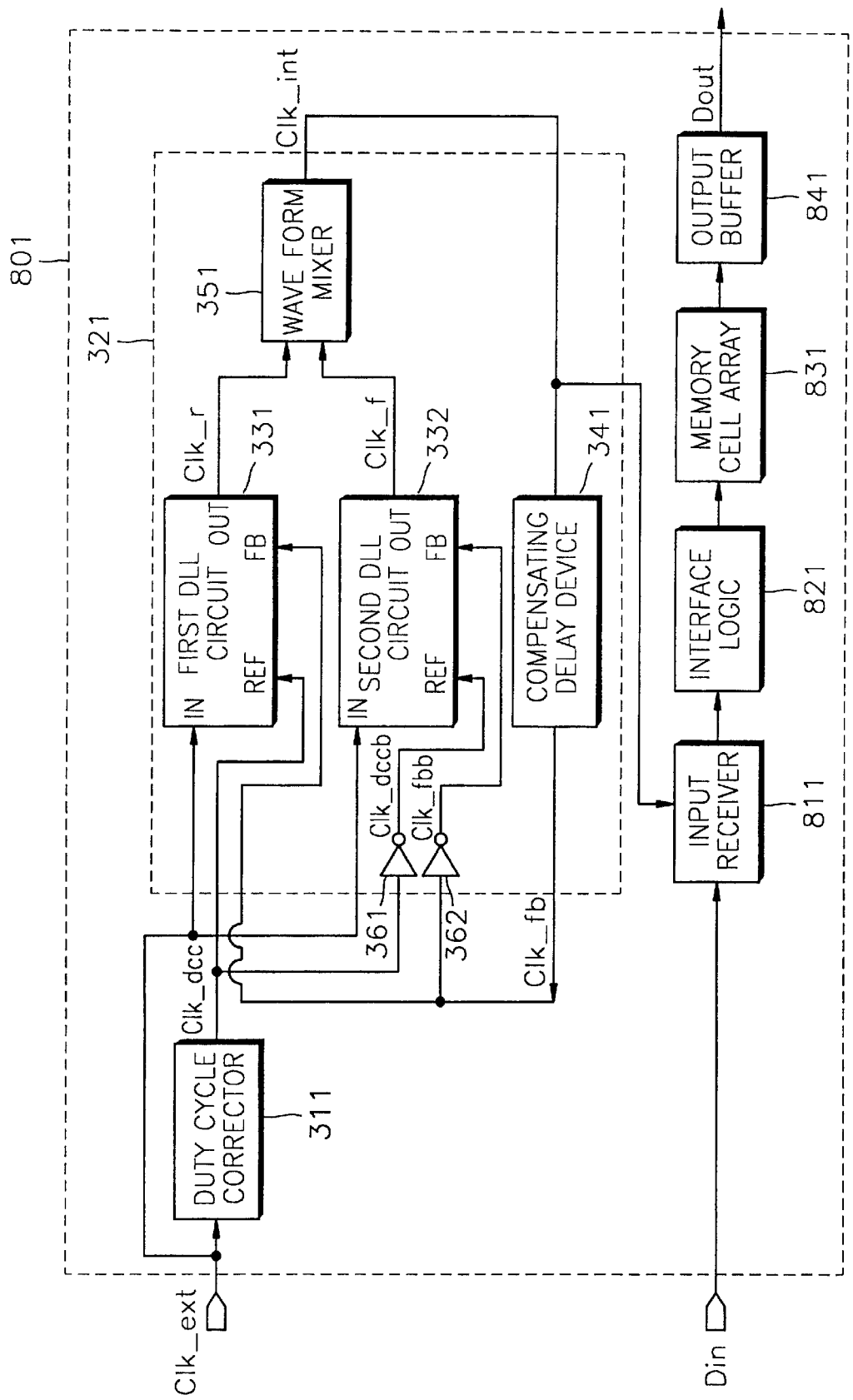
FIG. 8 is a block diagram that illustrates integrated circuit memory devices in accordance with embodiments of the present invention.

FIG. 8 is a block diagram that illustrates Rambus integrated circuit memory devices in accordance with embodiments of the present invention. A Rambus integrated circuit memory device 801 comprises the signal processing circuit 300 discussed hereinabove with respect to FIGS. 3–7A, and 7B along with an input receiver circuit 811, interface logic 821, a memory cell array 831, and an output buffer 841, which are configured as shown.

The input receiver circuit 811 generates processed data in response to input data Din and the internal clock signal Clk_int. The input receiver circuit 811 may generate the processed data at voltage levels that are compatible with the internal circuitry of the Rambus integrated circuit memory device 801. The interface logic 821 may be used to couple the processed data from the input receiver circuit 811 to the memory cell array 831 for storage therein. The output buffer 841 generates output data in response to the processed data stored in the memory cell array 831 and the internal clock signal Clk_int. The output buffer 841 may generate the output data at voltage levels that are compatible with external circuitry electrically connected to the Rambus integrated circuit memory device 801.

By using the internal clock signal Clk_int, which is generated by the signal processing circuit 300 in accordance with embodiments of the present invention, to drive various circuitry and components, malfunctions in the Rambus integrated circuit memory device 801 may be reduced as the internal clock signal Clk__int may have reduced jitter as discussed hereinabove. It will be further understood that embodiments of the signal processing circuit 300 may be applied to alternative integrated circuit devices without departing from the principles of the present invention.

From the foregoing, it can readily be seen that the present invention may be used to generate a duty-cycle corrected signal from an original signal without passing jitter from a duty-cycle corrector circuit into the duty-cycle corrected signal. Thus, the duty-cycle corrected signal may be used to drive other integrated circuit devices and may improve the reliability thereof due to the reduced jitter in the duty-cycle corrected signal.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

I claim:

1. A signal processing circuit, comprising:
    a first delay locked loop (DLL) circuit that generates a first intermediate output signal in response to an input signal and a phase difference between a leading edge of a reference signal, which is derived from the input signal, and a leading edge of a feedback signal; and
    a second DLL circuit that generates a second intermediate output signal in response to the input signal and a phase difference between a trailing edge of the reference signal and a trailing edge of the feedback signal, the feedback signal being derived from the first and second intermediate output signals.

2. A signal processing circuit as recited in claim 1, further comprising:
    a mixer circuit that generates an output signal in response to the first and second intermediate output signals.

3. A signal processing circuit as recited in claim 2, wherein the mixer circuit generates a leading edge transition of the output signal in response to a leading edge transition of the first intermediate output signal and the mixer circuit generates a trailing edge transition of the output signal in response to a trailing edge transition of the second intermediate output signal.

4. A signal processing circuit as recited in claim 2, wherein the output signal and the feedback signal are the same signal.

5. A signal processing circuit as recited in claim 2, further comprising:
    a delay circuit that generates the feedback signal in response to the output signal.

6. A signal processing circuit as recited in claim 2, wherein the mixer circuit comprises:
    a flip-flop circuit that generates the output signal in response to a set signal and a reset signal;
    a first logic circuit that generates the set signal in response to the first intermediate output signal; and
    a second logic circuit that generates the reset signal in response to the second intermediate output signal.

7. A signal processing circuit as recited in claim 1, further comprising:
    a duty-cycle corrector circuit that generates the reference signal in response to the input signal.

8. A signal processing circuit as recited in claim 1, wherein the first and second DLL circuits comprise:
    a delay unit that generates a plurality of delay signals corresponding to delayed versions of the input signal in response to the input signal.

9. A signal processing circuit as recited in claim 8, wherein the first DLL circuit further comprises:
    a first phase comparator circuit that determines the phase difference between the leading edge of the reference signal and the leading edge of the feedback signal in response to the reference signal and the feedback signal; and
    a first multiplexer that selects a first one of the plurality of delay signals in response to the phase difference between the leading edge of the reference signal and the leading edge of the feedback signal and outputs the first selected delay signal as the first intermediate output signal.

10. A signal processing circuit as recited in claim 9, wherein the first DLL circuit further comprises:
    a first register that latches the phase difference between the leading edge of the reference signal and the leading edge of the feedback signal therein and provides the phase difference between the leading edge of the reference signal and the leading edge of the feedback signal to the first multiplexer.

11. A signal processing circuit as recited in claim 9, wherein the second DLL circuit further comprises:
    a first inverter that generates a complementary reference signal in response to the reference signal;
    a second inverter that generates a complementary feedback signal in response to the feedback signal;
    a second phase comparator circuit that determines the phase difference between the trailing edge of the reference signal and the trailing edge of the feedback signal in response to the complementary reference signal and the complementary feedback signal; and
    a second multiplexer that selects a second one of the plurality of delay signals in response to the phase difference between the trailing edge of the reference signal and the trailing edge of the feedback signal and outputs the second selected delay signal as the second intermediate output signal.

12. A signal processing circuit as recited in claim 11, wherein the second DLL circuit further comprises:
    a second register that latches the phase difference between the trailing edge of the reference signal and the trailing edge of the feedback signal therein and provides the phase difference between the trailing edge of the reference signal and the trailing edge of the feedback signal to the second multiplexer.

13. An integrated circuit memory device, comprising:
    a first delay locked loop (DLL) circuit that generates a first intermediate output signal in response to an input signal and a phase difference between a leading edge of a reference signal, which is derived from the input signal, and a leading edge of a feedback signal;
    a second DLL circuit that generates a second intermediate output signal in response to the input signal and a phase difference between a trailing edge of the reference signal and a trailing edge of the feedback signal, the feedback signal being derived from the first and second intermediate output signals;
    an input receiver circuit that generates processed data in response to input data and the first and second intermediate output signals; and a memory cell array that stores the processed data therein in response to the first and second intermediate output signals.

14. An integrated circuit memory device as recited in claim 13, further comprising:
a mixer circuit that generates an output signal in response to the first and second intermediate output signals.

15. An integrated circuit memory device as recited in claim 14, wherein the mixer circuit generates a leading edge transition of the output signal in response to a leading edge transition of the first intermediate output signal and the mixer circuit generates a trailing edge transition of the output signal in response to a trailing edge transition of the second intermediate output signal.

16. An integrated circuit memory device as recited in claim 14, wherein the input receiver circuit generates the processed data in response to the input data and the output signal.

17. An integrated circuit memory device as recited in claim 14, further comprising:
interface logic that couples the processed data from the input receiver circuit to the memory cell array.

18. An integrated circuit memory device as recited in claim 17, further comprising:
an output buffer that generates output data in response to the data stored in the memory cell array and the output signal.

19. A method of processing a signal, comprising:
generating a first intermediate output signal in response to an input signal and a phase difference between a leading edge of a reference signal, which is derived from the input signal, and a leading edge of a feedback signal; and
generating a second intermediate output signal in response to the input signal and a phase difference between a trailing edge of the reference signal and a trailing edge of the feedback signal, the feedback signal being derived from the first and second intermediate output signals.

20. A method as recited in claim 19, further comprising:
generating an output signal in response to the first and second intermediate output signals.

21. A method as recited in claim 20, wherein generating the output signal in response to the first and second intermediate output signals comprises:
generating a leading transition of the output signal in response to a leading edge transition of the first intermediate output signal; and
generating a trailing edge transition of the output signal in response to a trailing edge transition of the second intermediate output signal.

22. A method as recited in claim 20, wherein the output signal and the feedback signal are the same signal.

23. A method as recited in claim 20, further comprising:
generating the feedback signal by applying a delay to the output signal.

24. A method as recited in claim 19, further comprising:
generating a plurality of delay signals corresponding to delayed versions of the input signal.

25. A method as recited in claim 24, wherein generating the first intermediate output signal comprises:
determining the phase difference between the leading edge of the reference signal and the leading edge of the feedback signal;
selecting a first one of the plurality of delay signals based on the phase difference between the leading edge of the reference signal and the leading edge of the feedback signal; and
generating the first intermediate output signal as the selected first one of the plurality of delay signals.

26. A method as recited in claim 25, wherein generating the second intermediate output signal comprises:
determining the phase difference between the trailing edge of the reference signal and the trailing edge of the feedback signal;
selecting a second one of the plurality of delay signals based on the phase difference between the trailing edge of the reference sign al and the trailing edge of the feedback signal; and
generating the second intermediate output signal as the selected second one of the plurality of delay signals.

27. A method of operating an integrated circuit memory device, comprising:
generating a first intermediate output signal in response to an input signal and a phase difference between a leading edge of a reference signal, which is derived from the input signal, and a leading edge of a feedback signal;
generating a second intermediate output signal in response to the input signal and a phase difference between a trailing edge of the reference signal and a trailing edge of the feedback signal, the feedback signal being derived from the first and second intermediate output signals;
processing input data in response to the first and second intermediate output signals; and
storing the processed data in the memory cell array in response to the first and second intermediate output signals.

28. A method as recited in claim 27, further comprising:
generating an output signal in response to the first and second intermediate output signals.

29. A method as recited in claim 28, wherein generating the output signal in response to the first and second intermediate output signals comprises:
generating a leading transition of the output signal in response to a leading edge transition of the first intermediate output signal; and
generating a trailing edge transition of the output signal in response to a trailing edge transition of the second intermediate output signal.

30. A method as recited in claim 28, wherein processing input data in response to the first and second intermediate output signals comprises:
processing input data in response to the output signal.

31. A method as recited in claim 28, further comprising:
generating output data in response to the data stored in the memory cell array and the output signal.

32. A signal processing system, comprising:
means for generating a first intermediate output signal in response to an input signal and a phase difference between a leading edge of a reference signal, which is derived from the input signal, and a leading edge of a feedback signal; and
means for generating a second intermediate output signal in response to the input signal and a phase difference between a trailing edge of the reference signal and a trailing edge of the feedback signal, the feedback signal being derived from the first and second intermediate output signals.

33. A signal processing system as recited in claim 32, further comprising:
means for generating a plurality of delay signals corresponding to delayed versions of the input signal.

34. A signal processing system as recited in claim 33, wherein the means for generating the first intermediate output signal comprises:

means for determining the phase difference between the leading edge of the reference signal and the leading edge of the feedback signal;

means for selecting a first one of the plurality of delay signals based on the phase difference between the leading edge of the reference signal and the leading edge of the feedback signal; and means for generating the first intermediate output signal as the selected first one of the plurality of delay signals.

35. A signal processing system as recited in claim 34, wherein the means ofr generating the second intermediate output signal comprises:

means for determining the phase difference between the trailing edge of the reference signal and the trailing edge of the feedback signal;

means for selecting a second one of the plurality of delay signals based on the phase difference between the trailing edge of the reference signal and the trailing edge of the feedback signal; and means for generating the second intermediate output signal as the selected second one of the plurality of delay signals.

36. An integrated circuit memory device, comprising:

means for generating a first intermediate output signal in response to an input signal and a phase difference between a leading edge of a reference signal, which is derived from the input signal, and a leading edge of a feedback signal;

means for generating a second intermediate output signal in response to the input signal and a phase difference between a trailing edge of the reference signal and a trailing edge of the feedback signal, the feedback signal being derived from the first and second intermediate output signals;

means for processing input data in response to the first and second intermediate output signals; and means for storing the processed data in the memory cell array in response to the first and second intermediate output signals.

37. An integrated circuit memory device as recited in claim 36, further comprising:

means for generating an output signal in response to the first and second intermediate output signals.

38. An integrated circuit memory device as recited in claim 37, wherein the means for generating the output signal in response to the first and second intermediate output signals comprises:

means for generating a leading transition of the output signal in response to a leading edge transition of the first intermediate output signal; and means for generating a trailing edge transition of the output signal in response to a trailing edge transition of the second intermediate output signal.

39. An integrated circuit memory device as recited in claim 37, wherein the means for processing input data in response to the first and second intermediate output signals comprises:

means for processing input data in response to the output signal.

40. An integrated circuit memory device as recited in claim 37, further comprising:

means for generating output data in response to the data stored in the memory cell array and the output signal.

* * * * *

UNITED STATES PATENT AND TRADEMARK OFFICE
CERTIFICATE OF CORRECTION

PATENT NO. : 6,452,432 B2
DATED : September 17, 2002
INVENTOR(S) : Kyu-hyoun Kim It is certified that error appears in the above-identified patent and that said Letters Patent is hereby corrected as shown below:

Column 14,
Line 10, should read as follows:
-- of the reference signal and the trailing edge of the --

Column 15,
Line 36, should read as follows:
-- wherein the means of generating the second intermediate --

Signed and Sealed this

First Day of April, 2003

JAMES E. ROGAN
*Director of the United States Patent and Trademark Office*